United States Patent
Kim

[11] Patent Number: 5,877,561
[45] Date of Patent: Mar. 2, 1999

[54] PLATE AND COLUMN TYPE SEMICONDUCTOR PACKAGE HAVING HEAT SINK

[75] Inventor: Sun Dong Kim, Choongcheongbuk-Do, Rep. of Korea

[73] Assignee: LG Semicon Co., Ltd., Cheongju, Rep. of Korea

[21] Appl. No.: 749,963

[22] Filed: Nov. 18, 1996

[30] Foreign Application Priority Data

Dec. 29, 1995 [KR] Rep. of Korea ............... 1995 67332

[51] Int. Cl.$^6$ ............ H01L 23/28; H01L 23/10; H01L 23/34
[52] U.S. Cl. ............ 257/796; 257/706; 257/707; 257/676
[58] Field of Search ............ 257/796, 706, 257/707, 676

[56] References Cited

U.S. PATENT DOCUMENTS

| | | | |
|---|---|---|---|
| 3,290,564 | 12/1966 | Wolff, Jr. | 257/796 |
| 3,947,867 | 3/1976 | Duffek et al. | 357/70 |
| 4,396,936 | 8/1983 | McIver et al. | 257/713 |
| 4,420,767 | 12/1983 | Hodge et al. | 257/713 |
| 4,975,761 | 12/1990 | Chu | 257/686 |
| 5,012,386 | 4/1991 | McShane et al. | 361/715 |
| 5,455,384 | 10/1995 | Ichihara | 174/52.2 |
| 5,471,011 | 11/1995 | Maslakow | 174/52.4 |
| 5,490,324 | 2/1996 | Newman | 29/830 |
| 5,523,622 | 6/1996 | Harada et al. | 257/734 |
| 5,574,309 | 11/1996 | Papapietro et al. | 257/679 |
| 5,600,101 | 2/1997 | Sakai | 174/261 |
| 5,604,328 | 2/1997 | Kubota et al. | 174/52.1 |
| 5,608,265 | 3/1997 | Kitano et al. | 257/738 |

*Primary Examiner*—Teresa M. Arroyo
*Attorney, Agent, or Firm*—Fleshner & Kim

[57] ABSTRACT

An improved plate and column type semiconductor package has a heat sink embedded in a plate, which prevents bending of leads or paddle. The plate includes a plurality of leads and a heat sink which are embedded therein, whereby the mounting of the semiconductor package on the printed circuit board is made easier. A semiconductor chip is attached to the heat sink of the plate and a plurality of metal wires electrically connects a plurality of the leads of the plate and the semiconductor chip.

15 Claims, 2 Drawing Sheets

PLATE AND COLUMN TYPE SEMICONDUCTOR PACKAGE HAVING HEAT SINK

TECHNICAL FIELD

The present invention relates to a semiconductor package, and more particularly, plate and column type semiconductor package having a heat sink.

BACKGROUND ART

A quad flat package (QFP)is one type of a semiconductor package, and FIG. 1 shows the construction of the conventional quad flat package. The quad flat package includes a semiconductor chip 3, a paddle 2 on which the semiconductor chip 3 is mounted, a lead frame 1 having a plurality of leads 1a, 1b provided at both sides of the paddle 2, and a plurality of metal wires 4 for electrically connecting the leads 1a of the lead frame 1 to the semiconductor chip 3. An epoxy molding compound 5 substantially encapsulates the lead frame 1 and has a predetermined thickness. The above-mentioned leads 1a, 1b are classified into an inner lead 1a and an outer lead 1b protruding from the epoxy molding compound.

The fabrication process of the conventional semiconductor package includes a first step for forming a lead frame 1 including leads and a paddle 2, a second step for mounting a semiconductor chip 3 on the paddle 2 of the lead frame 1, a third step for electrically connecting the leads of the lead frame 1 and the semiconductor chip 3 using a plurality of metal wires 4, and a fourth step for encapsulating the lead frame 1 using an epoxy molding compound. Thereafter, a trimming step, and a forming step are subsequently performed. The semiconductor package is then mounted on a printed circuit board, and information can be stored in the semiconductor chip and can be read from the same when voltage is supplied thereto.

However, the conventional semiconductor package is disadvantaged since the paddle 2 has an inclined portion resulting from pressure of an epoxy molding compound during the molding process. The leads can be easily bent by external impact force applied thereto since the leads extend to the outside after the molding process. Hence, the reliability of the semiconductor package is decreased.

In addition, it is difficult to accurately align and mount the semiconductor package having a plurality of extended leads on the printed circuit board. Moreover, the temperature of the semiconductor package increases during the operation of the semiconductor chip when a voltage is supplied to the chip, and the generated heat due to the increased temperature cannot be effectively emitted to the outside, thereby causing malfunctions and errors of the chip.

DISCLOSURE OF THE INVENTION

An advantage of the present invention is in providing a plate and column type semicondcutor package having a heat sink, which is capable of preventing bending of leads or paddle.

Another advantage of the present invention is in easier mounting of the semiconductor package on the printed circuit board.

A further advantage of the present invention is in preventing malfunctions due to the increased heat and effectively emitting heat generated in the semiconductor package.

Still a further advantage of the present invention is enhancing productivity by reducing fabricating process steps.

Such advantages and others are achieved in part by a first embodiment of the present invention having a semiconductor package with a heat sink, which includes a plate within which a plurality of leads and a heat sink are embedded; a semiconductor chip attached to the heat sink of the plate; a metal wire for electrically connecting a plurality of the leads of the plate and the semiconductor chip; and an epoxy molding compound for encapsulating a predetermined portion of the plate.

The semiconductor package also may have a heat sink, which includes a plate within which a plurality of leads and a heat sink are embedded in a shape of a column and in which a groove having a predetermined depth and a predetermined size is formed in a direction from the upper surface of the same to the lower surface of the same; a semiconductor chip attached to the heat sink of the plate; a metal wire for electrically connecting a plurality of the leads of the plate and the semiconductor chip; and a cover attached to the upper surface of the plate.

The above and other advantages of the invention are achieved in part by a component for forming a package of an integrated chip, comprising: a member having a predetermined shape and first and second surfaces, wherein the member includes a first metallic member formed in the first member for receiving the integrated chip, the first metallic member occupying a predetermined area of the first member and having a predetermined depth in a direction from the first surface to the second surface of the member; and a plurality of second metallic members formed in the member for connecting wire to the integrated chip.

The above and other advantages of the present invention are achieved also in part by a package, comprising: a) a plate having first and second surfaces, the plate having i) a metallic member formed in the first member, the first metallic member occupying a predetermined area of the plate; ii) a plurality of leads formed in the plate; b) an integrated chip mounted to the metallic member; c) a plurality of wires for connecting the plurality of leads to the integrated chip; and d) means for encapsulating a predetermined portion of the plate.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

BEST MODE FOR CARRYING OUT THE INVENTION

An improved plate and column type semiconductor package has a heat sink which is capable of more easily emitting heat generated in the interior of a semiconductor package. The semiconductor package enhances productivity by fabricating a semiconductor package using a unit column frame within which a plurality of leads and a heat sink are embedded. The plate type package body is sliced from the unit column frame at a regular interval.

Figure 1:
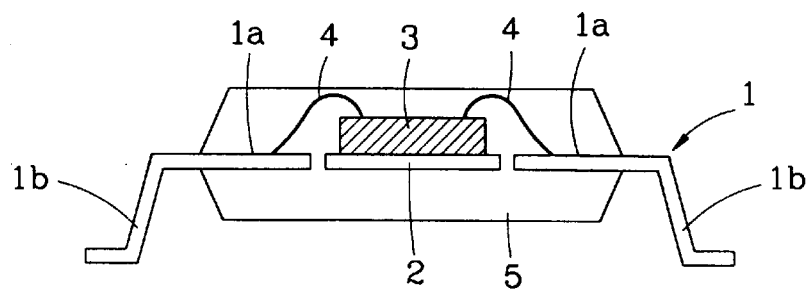
FIG. 1 is a vertical cross-sectional view of a conventional semiconductor package.
Figure 2A:
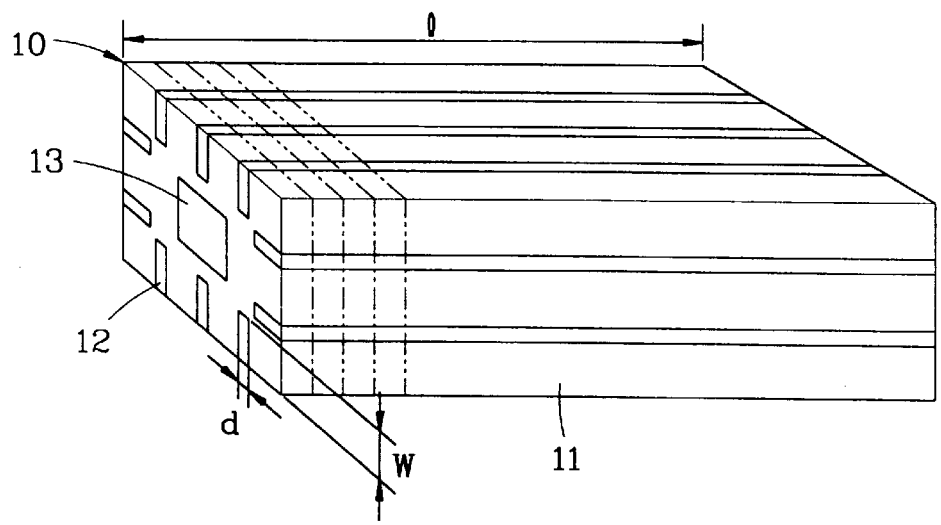
FIGS. 2A and 2B are perspective views of a unit column frame and a package body according to the present invention.
Figure 2B:
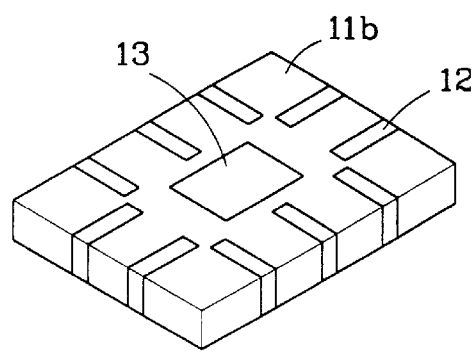

FIGS. 2A and 2B show a unit column frame and a sliced plate in accordance with the present invention. As shown therein, the unit column frame 10 includes a column-shaped body 11 having a predetermined length (l), and a column-shaped heat sink 13 embedded within the center portion of the body 11, and a plurality of leads 12 which are arranged at a periphery of the heat sink 13. The heat sink 13 is exposed to the upper and lower surfaces of the body 11, and a predetermined portion of the lead 12 is exposed to the surface of the body 11 by a predetermined thickness (d). In the drawing, one-dot-one-dash line denotes a cut-away portion of the body 11.

The column-type body 11 is generally made of an insulation material. The column-type body 11 is made in a square shape or other appropriate shape, e.g., circular. As can be appreciate, other shapes can be adapted to the present invention. The unit column frame 10 is sliced at a desired interval (thickness), for example, by 1 mm, 1.5 mm, or 2.0 mm. The sliced unit column frame 10 becomes a plate, which is used for fabricating a semiconductor package. A plurality of leads 12 embedded within the unit column frame 10 may be embedded within the unit column frame 10. The upper and lower portions of the leads 12 and the heat sink 13 are exposed to the body 11.

Figure 3:
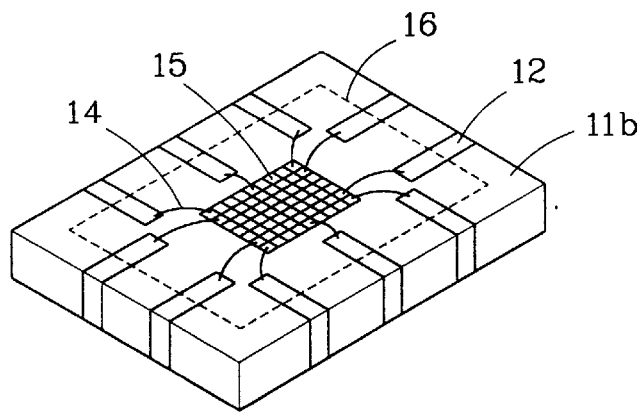
FIG. 3 is a perspective view of a plate type semiconductor package having a heat sink according to a first embodiment of the present invention.

FIG. 3 shows a plate-shaped semiconductor package having a heat sink according to a first embodiment of the present invention. As shown therein, a semiconductor chip 15 is mounted on the heat sink 13, and a semiconductor chip 15 and a plurality of leads 12 are electrically bonded to each other using the metal wire 14. The reference numeral 16 denotes a molding line. The upper portion of the plate 11b is sealed by encapsulation and hardening of an epoxy molding compound (not shown).

Figure 4:
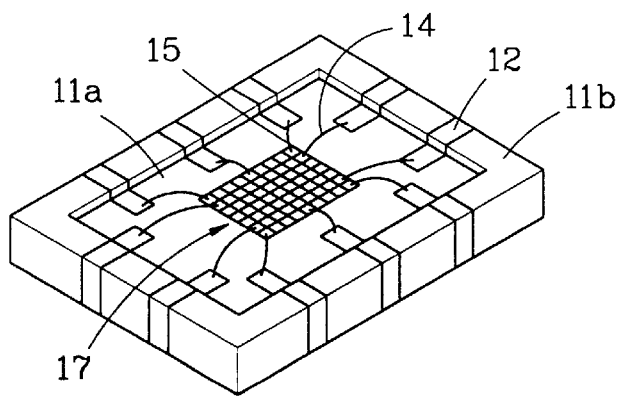
FIG. 4 is a perspective view of a plate type semiconductor package having a heat sink according to a second embodiment of the present invention.

FIG. 4 shows a plate-shaped semiconductor package having a heat sink according to a second embodiment of the present invention. As shown therein, a groove 11a is formed by grinding or polishing a predetermined upper portion of the plate 11b which is sliced from the unit column frame 10. Thereafter, a semiconductor mounting process, and a wire bonding process, which are described in the previous embodiment, are conducted. The groove 11a is encapsulated using an epoxy molding compound 17, thus forming a semiconductor package, whereby it is possible to fabricate a thinner semiconductor package as compared to the first embodiment of the present invention.

Figure 5:
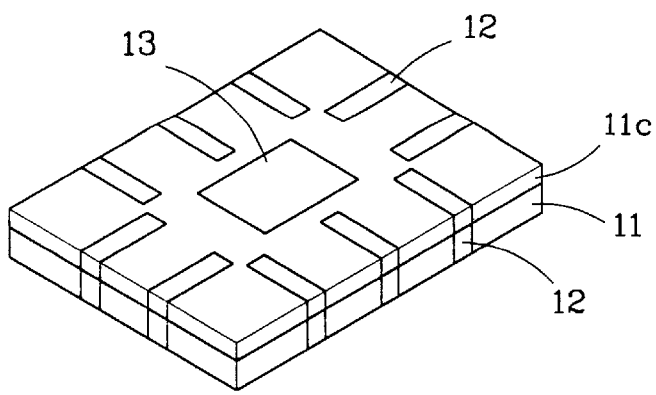
FIG. 5 is a perspective view of a plate type semiconductor package having a heat sink according to a third embodiment of the present invention.

FIG. 5 shows a plate-shaped semiconductor package having a heat sink according to a third embodiment of the present invention. A cover 11c is used instead of the epoxy molding compound of the previous embodiment of the present invention. The cover 1ic is obtained by slicing the unit column frame 10. A certain difference between the plate 11b and the cover 11c exists in their respective thickness.

In addition, as another embodiment of the present invention, the unit column frame may be attached to the lower surface of the pattern of the substrate in a column shape (not shown), or as another embodiment of the present invention, the lower surface of the unit column frame may be directly attached to the lower surface of the printed circuit board.

After the semiconductor package having the abovementioned construction is mounted on the printed circuit board, when voltage is supplied to the semiconductor package, the semiconductor chip of the semiconductor package is operated, thus reading and writing a predetermined information in the chip.

A plate having a heat sink and a column type semiconductor package of the present invention prevents a bending of leads. In addition, it is possible to more easily mount the chip on the substrate since a plurality of leads and the upper and lower surfaces of the plate- or column-shaped semiconductor package are exposed. In addition, lamination type structure is possible, so that the maintenance is easy.

Since the heat sink is exposed to the upper and lower surfaces of the plate- or column-shaped semiconductor package, heat from the interior of the package can be more effectively emitted to the outside, and thus reducing malfunctions of the chip. The fabrication process and cost can be reduced, and productivity is increased, as compared to the conventional semiconductor package fabrication process.

Although the preferred embodiments of the present invention have been disclosed for illustrative purposes, those skilled in the art will appreciate that various modifications, additions and substitutions are possible, without departing from the scope and spirit of the invention as described in the accompanying claims.

The foregoing embodiment is merely exemplary and not to be construed as limiting the present invention. The present invention can be readily applied to other type of semiconductor packages. One of ordinary skill in the art can use the teachings of the present invention to other devices requiring easier and smaller fabrication of semiconductor packages. The description of the present invention is intended to be illustrative, and not limiting the scope of the claims. Many alternatives, modifications and variations will be apparent to those skilled in the art.

I claim:

1. A semiconductor package, comprising:
   a plate within which a plurality of leads and a heat sink are embedded wherein the leads extend into the plate below an upper surface of the plate;
   a semiconductor chip attached to the heat sink of the plate;
   at least one metal wire for electrically connecting a plurality of the leads of the plate and the semiconductor chip; and
   an epoxy molding compound for encapsulating a predetermined portion of the plate.

2. The package of claim 1, wherein said plate is formed of an insulation material.

3. The package of claim 1, wherein an exterior periphery of said plate has a circular shape.

4. The package of claim 1, wherein said plate has a square surface.

5. The package of claim 1, wherein said plurality of leads and said heat sink are exposed to the upper and a lower surfaces of the plate, and wherein a lower surface of the heat sink is flush with the lower surface of the plate.

6. The package of claim 5, wherein said leads are exposed to sides of the plate.

7. The plate of claim 1, wherein said plate includes a groove having a predetermined depth and size and formed in a direction from the upper surface a lower surface of the same.

8. The semiconductor package of claim 1, wherein the leads extend from the upper surface of the plate to the lower surface of the plate throughout substantially an entire length of the leads.

9. A semiconductor package having a heat sink, comprising:

a plate within which a plurality of leads and a heat sink are embedded, the leads extending into the plate below an upper surface, and wherein a groove having a predetermined depth and a predetermined size is formed on the upper surface of the plate and extends in a direction from the upper surface to a lower surface of the plate;

a semiconductor chip attached to the heat sink of the plate;

at least one metal wire for electrically connecting a plurality of the leads of the plate and the semiconductor chip; and a cover attached to the upper surface of the plate.

10. The package of claim 9, wherein said plate is formed of an insulation material.

11. The package of claim 9, wherein an outer periphery of said plate has a circular shape.

12. The package of claim 9, wherein said plate has a square surface.

13. The package of claim 9, wherein said plurality of leads and said heat sink are exposed to the upper and lower surfaces of the plate, and wherein a lower surface of the heat sink is flush with the lower surface of the plate.

14. The package of claim 9, wherein said leads are exposed to the sides of the plate.

15. The semiconductor package of claim 9, wherein the leads extend from the upper surface of the plate to the lower surface of the plate throughout substantially an entire length of the leads.

* * * * *

UNITED STATES PATENT AND TRADEMARK OFFICE
CERTIFICATE OF CORRECTION

PATENT NO. : 5,877,561
DATED : March 2, 1999
INVENTOR(S) : Sung Dong KIM

It is certified that error appears in the above-indentified patent and that said Letters Patent is hereby corrected as shown below:

ON THE TITLE PAGE:

Item [30] Foreign Application Priority Data

July 28, 1995       [KR]   Rep. of Korea            1995 22839

Related U.S. Application Data

[63] Continuation-in-part of Ser. No. 687,929, July 29, 1996, pending.

Column 1, line 4, insert --This application is a continuation-in-part of copending application Serial No. 08/687,929, filed July 29, 1996, the disclosure of which is hereby incorporated by reference.--

Signed and Sealed this

Fifth Day of October, 1999

Attest:

Q. TODD DICKINSON

Attesting Officer          Acting Commissioner of Patents and Trademarks